United States Patent [19]

King

[11] 4,063,268
[45] Dec. 13, 1977

[54] SILICON-POLYSILICON INFRARED IMAGE DEVICE WITH ORIENTIALLY ETCHED DETECTOR

[75] Inventor: Gerard J. King, Alexandria, Va.

[73] Assignee: The United States of America as represented by the Secretary of the Army, Washington, D.C.

[21] Appl. No.: 705,500

[22] Filed: July 15, 1976

[51] Int. Cl.$^2$ .............................. H01L 27/14
[52] U.S. Cl. ..................... 357/30; 250/332; 250/370; 357/24; 357/60
[58] Field of Search ............ 357/24, 30, 60, 55, 357/32; 250/332, 370, 330, 338

[56] References Cited

U.S. PATENT DOCUMENTS

| | | | |
|---|---|---|---|
| 3,486,892 | 12/1969 | Rosvold | 357/60 |
| 3,883,437 | 5/1975 | Nummedal et al. | 357/30 X |

OTHER PUBLICATIONS

Gerritsen et al., "An Infrared Image Converter Equipped with an Array of Extrinsic Silicon Photodetectors," IEEE *Transactions on Electron Devices*, vol. ED-18, No. 11, Nov. 1971, pp. 1011-1015.

*Primary Examiner*—Stanley D. Miller, Jr.
*Assistant Examiner*—James W. Davie
*Attorney, Agent, or Firm*—Nathan Edelberg; Aubrey J. Dunn; Robert P. Gibson

[57] ABSTRACT

An infrared imaging device is made by SIP chip growth technology to form an array of extrinsic silicon infrared detectors on an insulating layer which is on one side of an infrared-transparent polysilicon layer. A perforated mask is on the opposite side of the polysilicon layer. The detectors each have the shape of a frustum of a right rectangular pyramid. During processing of the chip for detectors, charge coupled devices (CCDs) are also made on the chip. These CCD's are indirectly connected to respective detectors and to readout lines on the chip.

6 Claims, 3 Drawing Figures

SILICON-POLYSILICON INFRARED IMAGE DEVICE WITH ORIENTIALLY ETCHED DETECTOR

The invention described herein may be manufactured, used, and licensed by and for the United States Government for governmental purposes without the payment of any royalty thereon.

CROSS REFERENCE TO RELATED APPLICATION

This invention is an improvement over my invention as described in copending application Ser. No. 705,641, filed July 15, 1976, and entitled "SOS EXTRINSIC INFRARED DETECTOR AND READ-OUT DEVICE AND METHOD OF PREPARATION."

BACKGROUND OF THE INVENTION

This invention is in the field of solid-state imaging detectors for infrared. Various types of such detectors have been proposed, but have been difficult to make with good definition, low noise figures, and high quantum efficiencies. The instant invention takes advantage of the known (and desirable) silicon-insulator-polysilicion (SIP) on-chip growth technology. Extrinsic detectors using such a technology may be produced, but such detectors have low optical density in the infrared and require thicknesses incompatable with SIP. The instant invention is able to use SIP, and by using orientionally dependent etching (ODE), the thickness requirement for detectors is transformed into a lateral dimension. Exemplary reference for the above-mentioned technology are the book *Basic Integrated Circuit Engineering* by Hamilton and Howard, published in 1975 by McGraw-Hill Book Co. and bearing Library of Congress Catalog Card No. 74-23921, and the periodical *Proceedings of the IEEE* of January 1975. Pages 83–88 of the book and pages 63–66 of the periodical are particularly pertinent. Moreover, a "classical" paper on oriential etching is the paper by Bean and Gleim on pages 1469–1476 of *Proceedings of the IEEE*, Vol. 57, No. 9, of September 1969. A more recent article on ODE is on pages 545–552 of the April 1975 edition of the *Journal of the Electrochemical Society*.

SUMMARY OF THE INVENTION

The invention is an infrared imaging device. The device is made by SIP chip growth technology to form a two-dimensional array of incremental extrinsic detectors. ODE is used to make the detectors each have the shape of a frustum of a right rectangular pyramid, with the base of a pyramid on the chip. During processing of the chip for the detectors, charge coupled devices (CCDs) are also made on the chip. These CCDs are indirectly connected to respective detectors and to readout (drive) lines on the chip.

DETAILED DESCRIPTION OF THE INVENTION

Figure 1:
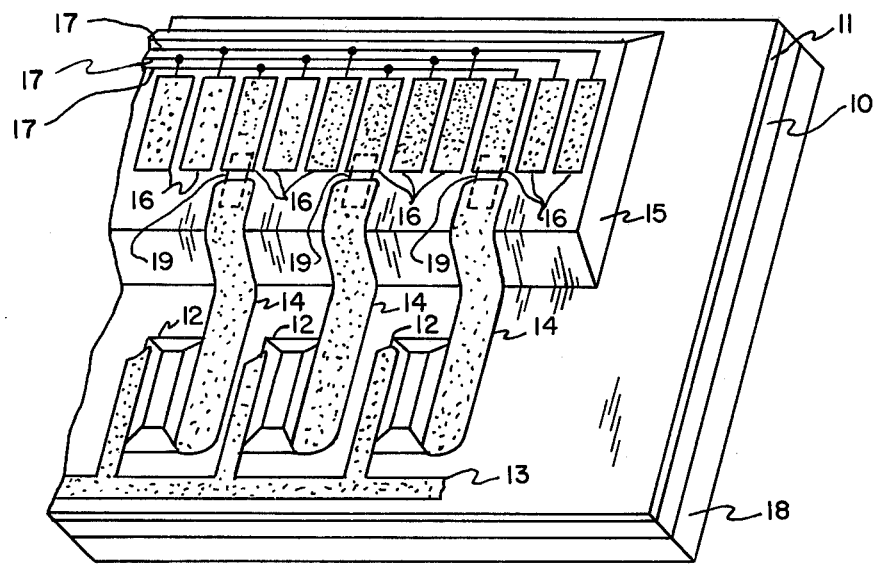
FIG. 1 is a partial schematic diagram of the inventive device.

The invention may perhaps be best understood by referring to the drawings of the inventive device, in which FIG. 1 shows layer 10 of polysilicon which acts as a mechanical support of the remainder of the device. Layer 11 is a thin silicon dioxide layer on layer 10. On layer 11 are detectors 12 having electrical connecting leads 13 and 14. As can be seen, lead 13 is common to one side of each of detectors 12. Reference numeral 15 designates a mesa of silicon doped for CCDs 16 having drive conductors 17. Additionally, doped coupling regions 19 are on mesa 15. Each of detectors 12 is connected to a respective one of coupling regions 19 by respective leads 14 for readout of the detectors. Layer 10 is covered on the opposite side from layer 11 by perforated mask 18.

Figure 2:
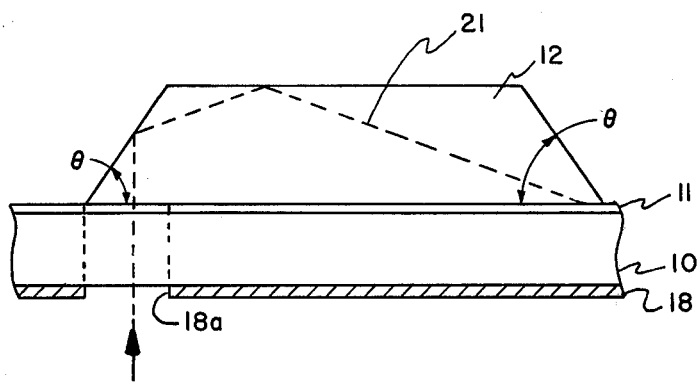
FIG. 2 is a sectional view of one detector of the device.

The shape of detectors 12 and placement of the perforations in mask 18 may be seen in FIG. 2. Each detector 12 is extrinsic silicon with an isosceles trapezoid cross-section, and with perforation 18a of the mask 18 at one end of 12. Infrared radiation from direction 20 thus passes through perforation 18a and enters detector 12. Angle $\theta$ of 12 is such that the radiation along dotted ray 21 is reflected to follow the path as shown. Radiation incident on 12 from direction 20 therefore has a long optical path in 12 compared to the thickness above layer 11 of detector 12. Such a long optical path allows greater absorption of photons than would be the case with only the thickness of 12.

Figure 3:
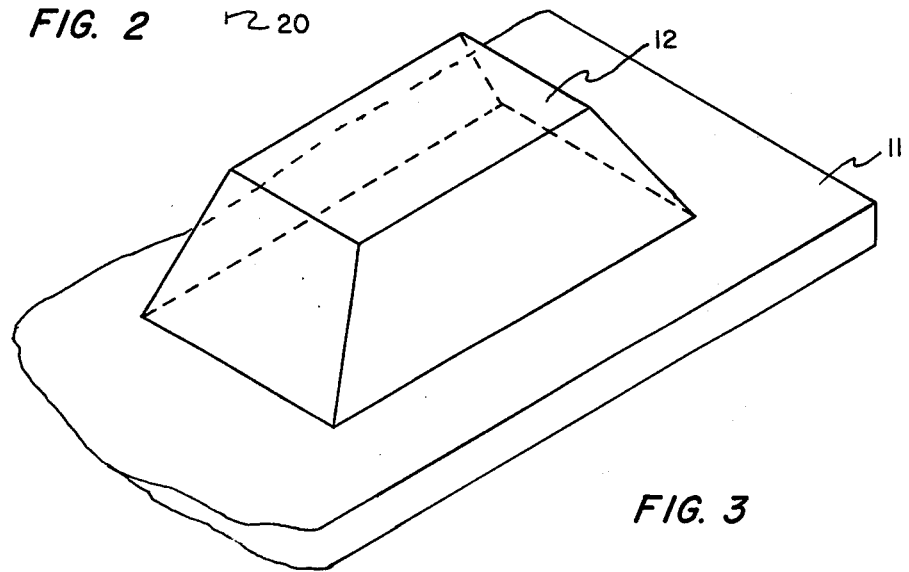
FIG. 3 is a pictorial view of one detector of the device.

FIG. 3 shows that detector 12 is a frustum of a right rectangular pyramid with its base on layer 11, with leads 13 and 14 connected along its longer trapezoidal faces (FIG. 1). As far as the crystalline structure of each detector if concerned, the top is the {100} plane, and each of the trapezoidal faces is a {111} plane. Angle $\theta$ for a typical etchant is 54.74°. A detector may have a base 0.003 inch by 0.01 inch as a typical size, with a 0.0016 inch height or thickness. Obviously, the drawings are not to scale, but have exaggerated dimensions for illustrations purposes. Apertures 18a may be 0.002 by 0.003 inch.

DESCRIPTION OF METHOD

The method whereby the above-described device may be produced is substantially known, but with variations to produce the instant device. The method begins with a growth substrate of epi-silicon (not shown on drawings). A layer of epitaxial silicon is grown on the substrate, a relatively thin layer 11 of silicon dioxide is grown on the epitaxial layer and a relatively thick layer 10 of polysilicon is grown on the dioxide layer. The growth substrate is then removed by etching, and the epitaxial layer is masked and doped for infrared sensitive extrinsic regions. The mask is stripped and a second mask is applied. The unmasked portion of the epitaxial is doped to produce a region capable of charge coupled device (CCD) action and to produce coupling regions. The second mask is removed and a third mask is applied. The epitaxial layer is then orientially etched through the third mask to produce a two-dimensional array of infrared detectors 12 from the previously doped infrared sensitive regions, and to produce an area capable of CCD action from the previously doped region capable of CCD action. The CCD area and each of the detectors is the shape of the shallow frustum of a right rectangular pyramid, with the longer sides of the detector pyramids being parallel. The detector array is thus an array of rows and columns of detectors 12 with equal spaces between the rows and columns. Since the detectors and the CCD area are on a silicon dioxide layer, they are electrically isolated from each other. The third mask is stripped from the epitaxial layer and a forth mask is applied through which a CCD pad array is deposited, and through which lead conductors 13 and 14 for the CCD pads 16 and detectors 12 are deposited. A common lead is deposited for one side of each detector, and individual leads are deposited from respective detectors to respective coupling regions 19. The fourth mask is stripped after the leads are deposited, and an infrared opaque mask is applied to the polysilicon substrate. This opaque mask has square perforations aligned with one end of each of the rectangular detectors.

While a specific method of making the invention has been described, variations are possible in this method within the scope of the invention. For example, the various steps of masking, doping and etching may be interchanged or combined in part, and the opaque mask may be applied at any time in the process.

I claim:

1. An imaging infrared detector device including an infrared transparent support substrate:

an infrared transparent insulating layer on one side of said substrate;

an array of infrared detectors on said insulating layer, each detector being a frustum of a right rectangular pyramid with its base on said insulating layer;

electrical readout means including a common connector to one side of each of said detectors, and individual connectors to an opposite side of each of said detectors; and a perforated mask on the opposite side of said substrate from said insulating layer, with respective perforations aligned with an end of respective detectors.

2. The device as recited in claim 1 wherein said substrate is polysilicon.

3. The device as recited in claim 2 wherein said insulating layer is silicon dioxide.

4. The device as recited in claim 3 wherein said detectors are extrinsic silicon.

5. The device as recited in claim 4 wherein said detectors are in an array, with longer sides of said detectors parallel.

6. The device as recited in claim 5 wherein said perforations have dimensions no greater than the least dimension of the base of said detectors.

* * * * *